(12) United States Patent
Adhikari et al.

(10) Patent No.: US 8,412,368 B2
(45) Date of Patent: *Apr. 2, 2013

(54) METHOD AND APPARATUS FOR ROUTING DISPATCHING AND ROUTING RETICLES

(75) Inventors: Diwaskar Adhikari, Austin, TX (US); Raymond G. Goss, Austin, TX (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 282 days.

This patent is subject to a terminal disclaimer.

(21) Appl. No.: 12/900,085

(22) Filed: Oct. 7, 2010

(65) Prior Publication Data

US 2012/0089245 A1   Apr. 12, 2012

(51) Int. Cl.
*G06F 17/00* (2006.01)

(52) U.S. Cl. ........ 700/100; 700/108; 700/112; 700/121; 700/149; 700/226; 700/101; 700/102; 700/113; 700/96; 700/230; 414/222.01; 414/222.02; 414/281; 414/937

(58) Field of Classification Search ............... 700/100, 700/112, 226, 215, 213, 228
See application file for complete search history.

(56) References Cited

U.S. PATENT DOCUMENTS

| | | | |
|---|---|---|---|
| 6,457,587 B1 * | 10/2002 | Conboy et al. | 209/630 |
| 6,604,010 B2 * | 8/2003 | Lyoo et al. | 700/100 |
| 6,687,563 B1 * | 2/2004 | Wang et al. | 700/121 |
| 6,826,441 B2 * | 11/2004 | Yamagishi | 700/121 |
| 7,085,614 B1 * | 8/2006 | Gartland et al. | 700/100 |
| 7,487,099 B2 * | 2/2009 | Gartland et al. | 705/1.1 |
| 2002/0164242 A1 * | 11/2002 | Wehrung et al. | 414/935 |
| 2004/0039469 A1 * | 2/2004 | Lin | 700/100 |
| 2004/0073331 A1 * | 4/2004 | Chang et al. | 700/223 |
| 2004/0111339 A1 * | 6/2004 | Wehrung et al. | 705/30 |
| 2005/0075748 A1 * | 4/2005 | Gartland et al. | 700/108 |
| 2006/0025880 A1 * | 2/2006 | Chukka et al. | 700/121 |
| 2006/0064188 A1 * | 3/2006 | Ushiku et al. | 700/96 |
| 2006/0149404 A1 * | 7/2006 | Denton et al. | 700/99 |
| 2007/0168318 A1 * | 7/2007 | Burda et al. | 707/1 |
| 2007/0244594 A1 * | 10/2007 | Chik et al. | 700/112 |
| 2007/0276529 A1 * | 11/2007 | Brill et al. | 700/112 |
| 2008/0112787 A1 * | 5/2008 | Rebstock | 414/749.1 |
| 2008/0183324 A1 * | 7/2008 | Krisnamuthi et al. | 700/112 |
| 2008/0275582 A1 * | 11/2008 | Nettles et al. | 700/100 |
| 2008/0299684 A1 * | 12/2008 | Rothe et al. | 438/14 |
| 2009/0196716 A1 * | 8/2009 | Rebstock | 414/222.01 |
| 2010/0232914 A1 * | 9/2010 | Adhikari et al. | 414/222.02 |
| 2010/0318209 A1 * | 12/2010 | Goss et al. | 700/100 |
| 2012/0203367 A1 * | 8/2012 | Burda et al. | 700/101 |

OTHER PUBLICATIONS

Tamehiro, "New jobs Classes for fully automated Reticle and Sorter Dispatch", 2005, IBM, pp. 59-62.*
Yamagishi, "The World's First Automated Reticle Handling Systen Using OHT", 2003, pp. 21-24.*
Lin et al, "A Hybrid push/pull dispatching rule for a photobay in a 300 mm wafer fab", 2006, pp. 47-55.*

\* cited by examiner

*Primary Examiner* — Jeffrey A Gaffin
*Assistant Examiner* — Olvin Lopez Alvarez
(74) *Attorney, Agent, or Firm* — Williams, Morgan & Amerson, P.C.

(57) ABSTRACT

A method includes generating a reticle transport job using a computing device. The reticle job identifies a selected reticle. A reticle pod available for transporting the reticle is autonomously identified using the computing device. The reticle transport job is updated suing the computing device with an identifier of the reticle pod.

15 Claims, 6 Drawing Sheets

METHOD AND APPARATUS FOR ROUTING DISPATCHING AND ROUTING RETICLES

CROSS-REFERENCE TO RELATED APPLICATIONS

Not applicable.

BACKGROUND

This disclosed subject matter pertains to automated manufacturing environments, such as semiconductor manufacturing, and, more particularly, to a method and apparatus for routing dispatching and routing reticles.

Growing technological requirements and the worldwide acceptance of sophisticated electronic devices have created an unprecedented demand for large-scale, complex, integrated circuits. Competition in the semiconductor industry requires that products be designed, manufactured, and marketed in the most efficient manner possible. This requires improvements in fabrication technology to keep pace with the rapid improvements in the electronics industry. Meeting these demands spawns many technological advances in materials and processing equipment and significantly increases the number of integrated circuit designs. These improvements also require effective utilization of computing resources and other highly sophisticated equipment to aid, not only design and fabrication, but also the scheduling, control, and automation of the manufacturing process.

Turning first to fabrication, integrated circuits, or microchips, are manufactured from modern semiconductor devices containing numerous structures or features, typically the size of a few micrometers or less. The features are placed in localized areas of a semiconducting substrate, and are either conductive, non-conductive, or semi-conductive (i.e., rendered conductive in defined areas with dopants). The fabrication process generally involves processing a number of wafers through a series of fabrication tools. Each fabrication tool performs one or more of four basic operations discussed more fully below. The four basic operations are performed in accordance with an overall process to finally produce the finished semiconductor devices.

Integrated circuits are manufactured from wafers of a semiconducting substrate material. Layers of materials are added, removed, and/or treated during fabrication to create the integrated, electrical circuits that make up the device. The fabrication essentially comprises the following four basic operations:

layering, or adding thin layers of various materials to a wafer from which a semiconductor is produced;
patterning, or removing selected portions of added layers;
doping, or placing specific amounts of dopants in selected portions of the wafer through openings in the added layers; and
heat treating, or heating and cooling the materials to produce desired effects in the processed wafer.

Although there are only four basic operations, they can be combined in hundreds of different ways, depending upon the particular fabrication process.

The formation of various integrated circuit (IC) structures on a wafer often relies on lithographic processes, sometimes referred to as photolithography, or simply lithography. As is well known, lithographic processes can be used to transfer a pattern of a photomask (also referred to herein as a mask or a reticle) to a wafer.

For instance, patterns can be formed from a photoresist layer disposed on the wafer by passing light energy through a mask having an arrangement to image the desired pattern onto the photoresist layer. As a result, the pattern is transferred to the photoresist layer. In areas where the photoresist is sufficiently exposed, and after a development cycle, the photoresist material becomes soluble such that it can be removed to selectively expose an underlying layer (e.g., a semiconductor layer, a metal or metal containing layer, a dielectric layer, a hard mask layer, etc.). Portions of the photoresist layer not exposed to a threshold amount of light energy will not be removed and serve to protect the underlying layer during further processing of the wafer (e.g., etching exposed portions of the underlying layer, implanting ions into the wafer, etc.). Thereafter, the remaining portions of the photoresist layer can be removed.

To facilitate processing of wafers through a process flow, wafers are typically grouped into lots. Each lot is typically housed in a common wafer pod wafer, commonly referred to as front opening unified pod (FOUP). FOUPs or pods are transported to various process and metrology tools throughout the fabrication facility to allow the required processes to be completed to fabricate integrated circuit devices on the wafers.

Modern wafer fabrication facilities employ automated material movement systems to satisfy ergonomic concerns and to maintain a high level of automation. An interbay/intrabay vehicle automated material handling system (AMHS) may be employed to automate the transfer of wafers to the tools required in the process flow.

One limitation of current material handling systems is that lots may only be dispatched to tools that are currently capable of performing the next operation required in the process flow. In terms of photolithography tools, a lot may only be dispatched to a tool that has the particular reticle required for the next patterning operation loaded into its reticle storage area. Due to the high number of patterning steps required to complete a fabrication process, the number of different device types being simultaneously fabricated, and the limited number of reticle sets, only a limited number of photolithography tools are eligible to process a particular lot for a given operation.

The dispatching system will not allow the manual or automatic creation of a job order for a lot to a tool without the required reticle set. Changing the reticles loaded in a particular tool requires manual operator intervention or waiting until the reticle is dispatched via automation in a pre-process step. The operator must identify the required reticle set, determine which reticle carrier is loaded with the reticle set, and dispatch the reticle carrier to the tool for loading. The operator must do this manual operation in advance of a particular lot needing processing. This operation may be partially automated by having the operator provide lists of reticles to move one time per hour, several hours before the reticles will be needed.

Due to the dynamically changing work stream in a fabrication facility, bottlenecks may occur at certain photolithography tools due to the limited availability of reticles. It is difficult for an operator to predict these bottlenecks in advance, so it is often the case that the operator must respond to the bottlenecks after they occur, resulting in lost productivity.

This section of this document is intended to introduce various aspects of art that may be related to various aspects of the disclosed subject matter described and/or claimed below. This section provides background information to facilitate a better understanding of the various aspects of the disclosed subject matter. It should be understood that the statements in this section of this document are to be read in this light, and not as admissions of prior art. The disclosed subject matter is directed to overcoming, or at least reducing the effects of, one or more of the problems set forth above.

BRIEF SUMMARY

The following presents a simplified summary of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

One aspect of the disclosed subject matter is seen in a method includes generating a reticle transport job using a computing device. The reticle job identifies a selected reticle. A reticle pod available for transporting the reticle is autonomously identified using the computing device. The reticle transport job is updated suing the computing device with an identifier of the reticle pod.

Another aspect of the disclosed subject matter is seen in a system including a photolithography tool, a material handling system for transporting reticles and wafers to the tool, and a coordinator. The coordinator is operable to generate a reticle transport job identifying a selected reticle required by the photolithography tool, identify a reticle pod available for transporting the reticle, and update the reticle transport job with an identifier of the reticle pod.

BRIEF DESCRIPTION OF THE SEVERAL VIEWS OF THE DRAWINGS

The disclosed subject matter will hereafter be described with reference to the accompanying drawings, wherein like reference numerals denote like elements, and.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION

One or more specific embodiments of the disclosed subject matter will be described below. It is specifically intended that the disclosed subject matter not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the disclosed subject matter unless explicitly indicated as being "critical" or "essential."

The disclosed subject matter will now be described with reference to the attached figures. Various structures, systems and devices are schematically depicted in the drawings for purposes of explanation only and so as to not obscure the disclosed subject matter with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1:
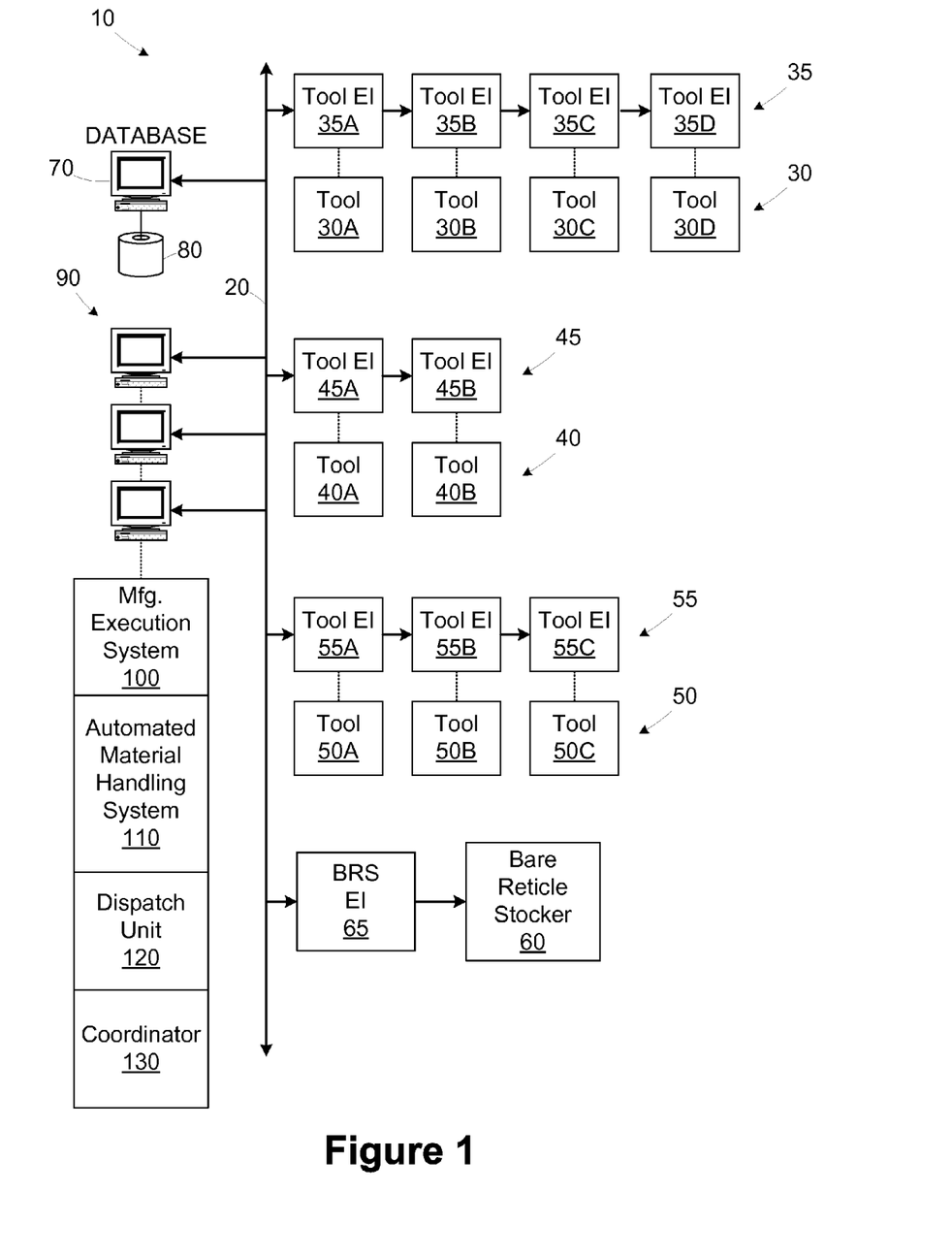
FIG. 1 is a simplified block diagram of a manufacturing system.

Referring now to the drawings wherein like reference numbers correspond to similar components throughout the several views and, specifically, referring to FIG. 1, the disclosed subject matter shall be described in the context of an illustrative manufacturing system 10. The manufacturing system 10 includes a network 20, a plurality of tools 30-50, an optional bare reticle stocker 60, a database server 70 and its associated data store 80, and a plurality of computers or workstations 90. The workstations 90, independently or collectively, implement various manufacturing control entities for the manufacturing system 10, including a manufacturing execution system (MES) 100, an automated material handling system (AMHS) 110, a dispatch unit 120, and a coordinator 130.

In the illustrated embodiment, the manufacturing system 10 is adapted to fabricate semiconductor devices. The techniques described herein may be applied to a variety of semiconductor devices, including, but not limited to, microprocessors, memory devices, digital signal processors, application specific integrated circuits (ASICs), or other devices.

Portions of the detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

The network 20 interconnects various components of the manufacturing system 10, allowing them to exchange information. For interfacing with the network 20, the tools 30, 40, 50 may have associated equipment interfaces 35, 45, 55 and the bare reticle stocker 60 may also have an equipment interface 65. The equipment interfaces may be implemented as separate entities communicating with the associated tool 30-50 or the bare reticle stocker 60 or integrated into the associated entity.

A particular wafer or lot of wafers progresses through the tools 30-50 as it is being manufactured, with each tool 30-50 performing a specific function in the process flow. Exemplary processing tools for a semiconductor device fabrication environment include metrology tools, photolithography tools, etch tools, deposition tools, polishing tools, rapid thermal processing tools, implantation tools, etc. The tools 30-50 are grouped into sets of like tools, as denoted by lettered suffixes. For example, the set of tools 30A-30C represent tools of a certain type, such as a photolithography tool. The tools 30-80 are illustrated in a rank and file grouping for illustrative purposes only. In an actual implementation, the tools 30-80 may be arranged in any physical order or grouping. Additionally, the connections between the equipment interfaces in a particular grouping are meant to represent connections to the network 20, rather than interconnections between the tools 30-80.

The manufacturing execution system (MES) 100 directs the high level operation of the manufacturing system 10. The MES 100 monitors the status of the various entities in the manufacturing system 10 (i.e., lots, tools 30-50) and controls the flow of articles of manufacture (e.g., lots of semiconductor wafers) through the process flow. The database server 70 stores data related to the status of the various entities and articles of manufacture in the process flow using one or more data stores 80. The data may include pre-process and post-process metrology data, tool states, lot priorities, etc.

The MES 100 stores information in the data store 80 related to the particular tools 30-50 (i.e., or sensors (not shown) associated with the tools 30-50) used to process each lot of wafers. As metrology data is collected related to the lot, the metrology data and a tool identifier indicating the identity of the metrology tool recording the measurements is also stored in the data store 80. The metrology data may include feature measurements, process layer thicknesses, electrical performance, surface profiles, etc. Data stored for the tools 30-50 may include chamber pressure, chamber temperature, anneal time, implant dose, implant energy, plasma energy, processing time, etc.

Data associated with the operating recipe settings used by the tool 30-50 during the fabrication process may also be stored in the data store 80. For example, it may not be possible to measure direct values for some process parameters. These settings may be determined from the operating recipe in lieu of actual process data from the tool 30-50. Photolithography operating recipes may specify (i.e., directly or by database association) a particular reticle set required for the operation.

The distribution of the processing and data storage functions amongst the different computers 70, 90 is generally conducted to provide independence and a central information store. Of course, different numbers of computers and different arrangements may be used.

Figure 2:
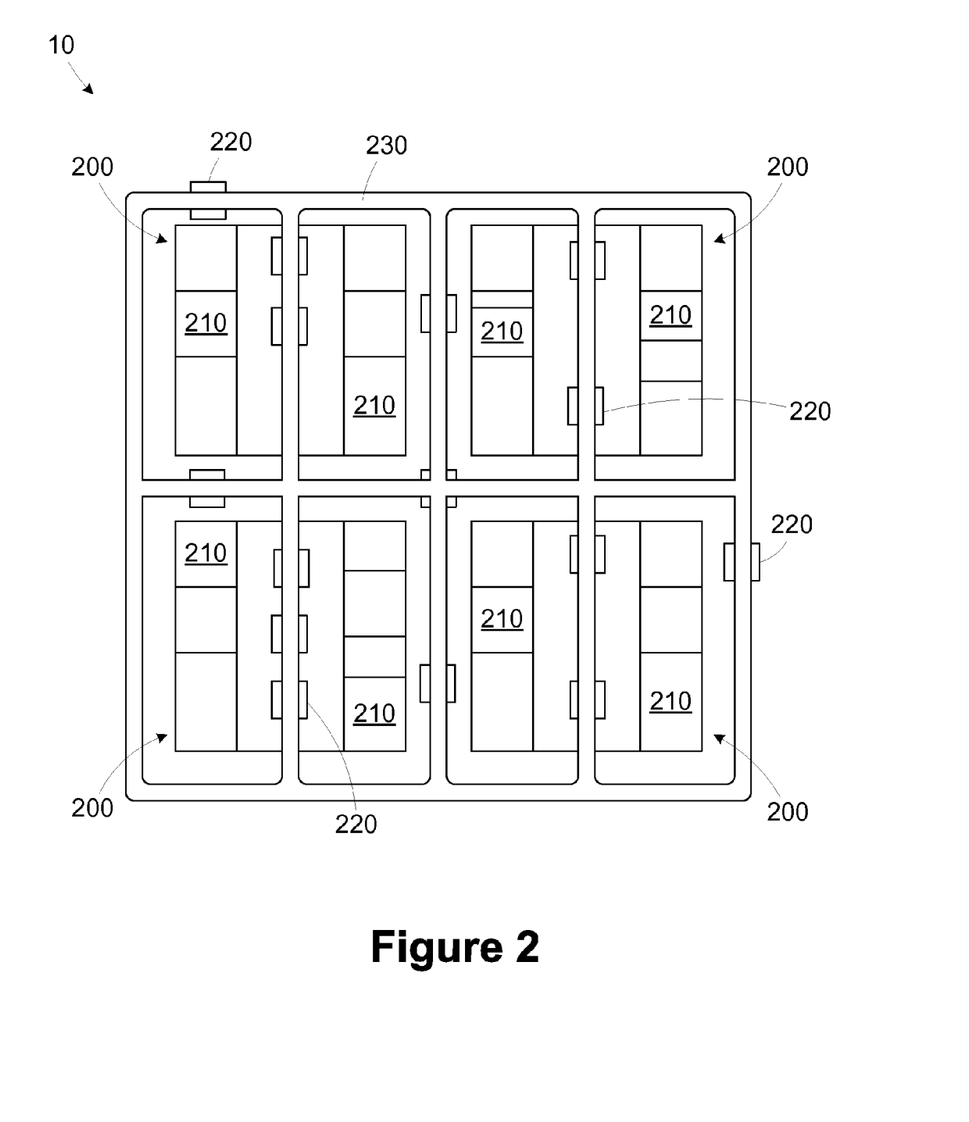
FIG. 2 is a simplified layout diagram of the manufacturing system.

As will be described in greater detail below, the AMHS 110 determines the allocation of material handling resources throughout the fabrication facility. In general, the AMHS 110 is responsible for moving FOUPs or pods containing wafers or reticles to the various tools in the manufacturing system 10. FIG. 2 illustrates a simplified layout diagram of the manufacturing system 10. The layout diagram is not intended to reflect an actual physical diagram of the layout, but rather a reduced scope conceptual diagram used in illustrating the techniques described herein. The manufacturing system 10 includes a plurality of control areas 200, sometimes referred to as bays. In FIG. 2, four control areas are illustrated, however, in an actual fabrication facility, many more control areas (e.g., 20-30) would be present. Each control area includes a plurality of tools 210 (e.g., the tools 30-50) of FIG. 1. The particular tools 210 selected for each control area 200 may vary depending on the organization of the fabrication facility. In one example, tools in a common tool family may be grouped in common control areas 200. Hence, photolithography tools may be located in one control area 200, while etch tools may be located in another control area 200. In another example, the tools 210 may be grouped by process layer. Hence, the tools required to form a particular layer (i.e., starting with a photolithography step and terminating prior to the next photolithography step) may be grouped into a common control area 200.

In the system 10 of FIG. 2, material handling vehicles 220 are provided for moving wafer pods, also referred to as front opening unified pods (FOUPs), to tools 210 within a control area (i.e., intrabay moves) or between different control areas (i.e., interbay moves). The number of material handling vehicles 220 and wafer pods may vary depending on the particular implementation. In the illustrated embodiment, an overhead transit framework 230 is provided. The material handling vehicles 220 are suspended from the framework 230 as they transit the system 10. However, it should be understood that the present subject matter is not limited to use with vehicles that are suspended from such a framework. Rather, the present subject matter may be employed with any type of material handling system that delivers wafer pods to a tool or location.

Figure 3:
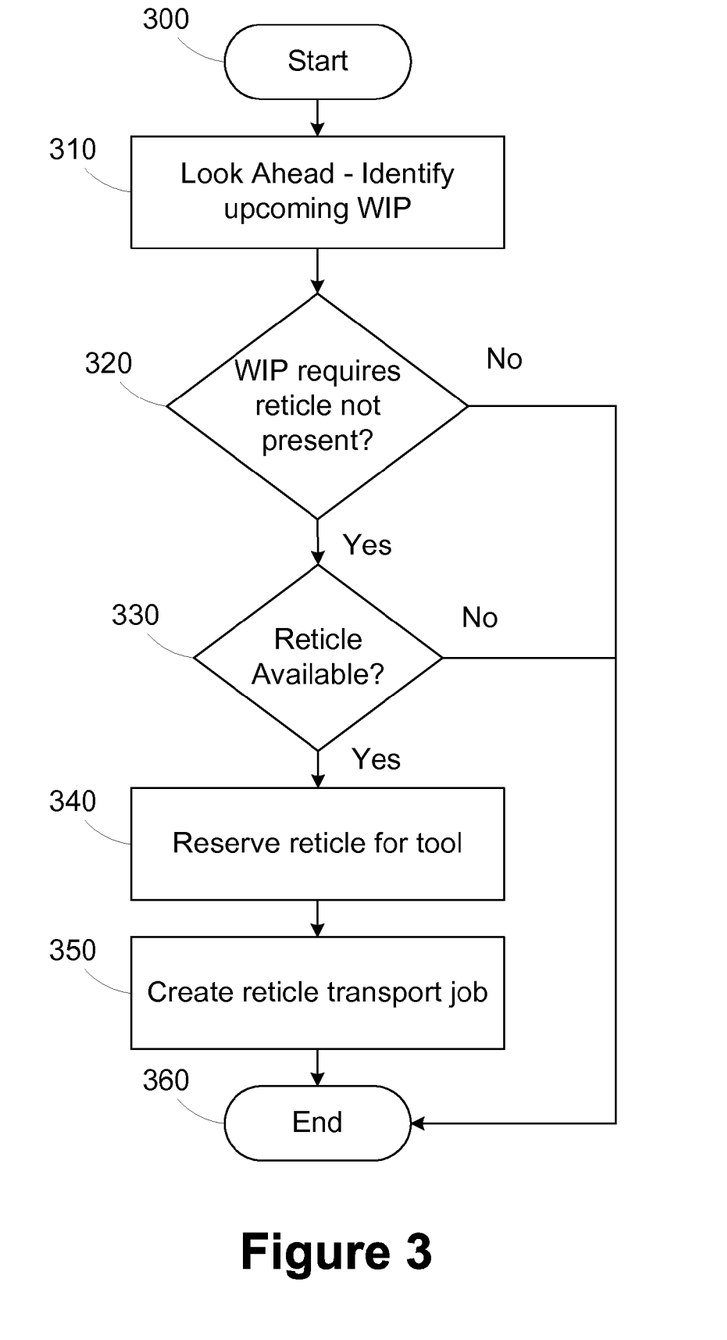
FIGS. 3 and 4 are simplified flow diagrams of methods for generating reticle transport jobs in accordance with embodiments of the present subject matter.

The operation of the manufacturing system 10 for implementing automated reticle transport is now described in reference to the following flow and event diagrams. FIG. 3 is a simplified block diagram of a method for generating reticle transport jobs in accordance with one illustrative embodiment of the present subject matter. In the approach of FIG. 3, the coordinator 130 looks at the current lot, referred to as WIP, selected for dispatch to a tool by the dispatch unit 120. The method starts in method block 300, and the coordinator 130 identifies the upcoming WIP in method block 310 using a look-ahead technique. In method block 320, the coordinator 130 determines if the identified WIP requires a reticle not currently on the tool. If the reticle is already present, the method terminates in method block 360. If the reticle is not present, the coordinator determines if the reticle is available in method block 330. If it is available, the coordinator 130 reserves the reticle for the tool in method block 340, creates a reticle transport job to send the reticle to the tool in method block 350. The method terminates in method block 360. If the reticle is not available in method block 330, the method terminates in method block 360, and no reservation is made for the WIP. Subsequently, the dispatch unit 120 may attempt to dispatch a different lot to the tool for processing, and the reticle evaluation would be repeated. The approach of FIG. 3 allows a tool reservation to be initiated even though the reticle is not currently available in the tool. The presence of the reticle transport job allows the tool reservation to be completed. The timing requirements for the tool reservation may need to be configured to provide time for the reticle transport job to complete. The start of the lot transport may be delayed to allow the reticle to arrive prior to the lot, or a wait time may be established to allow the lot to wait at the tool for the reticle.

Figure 4:
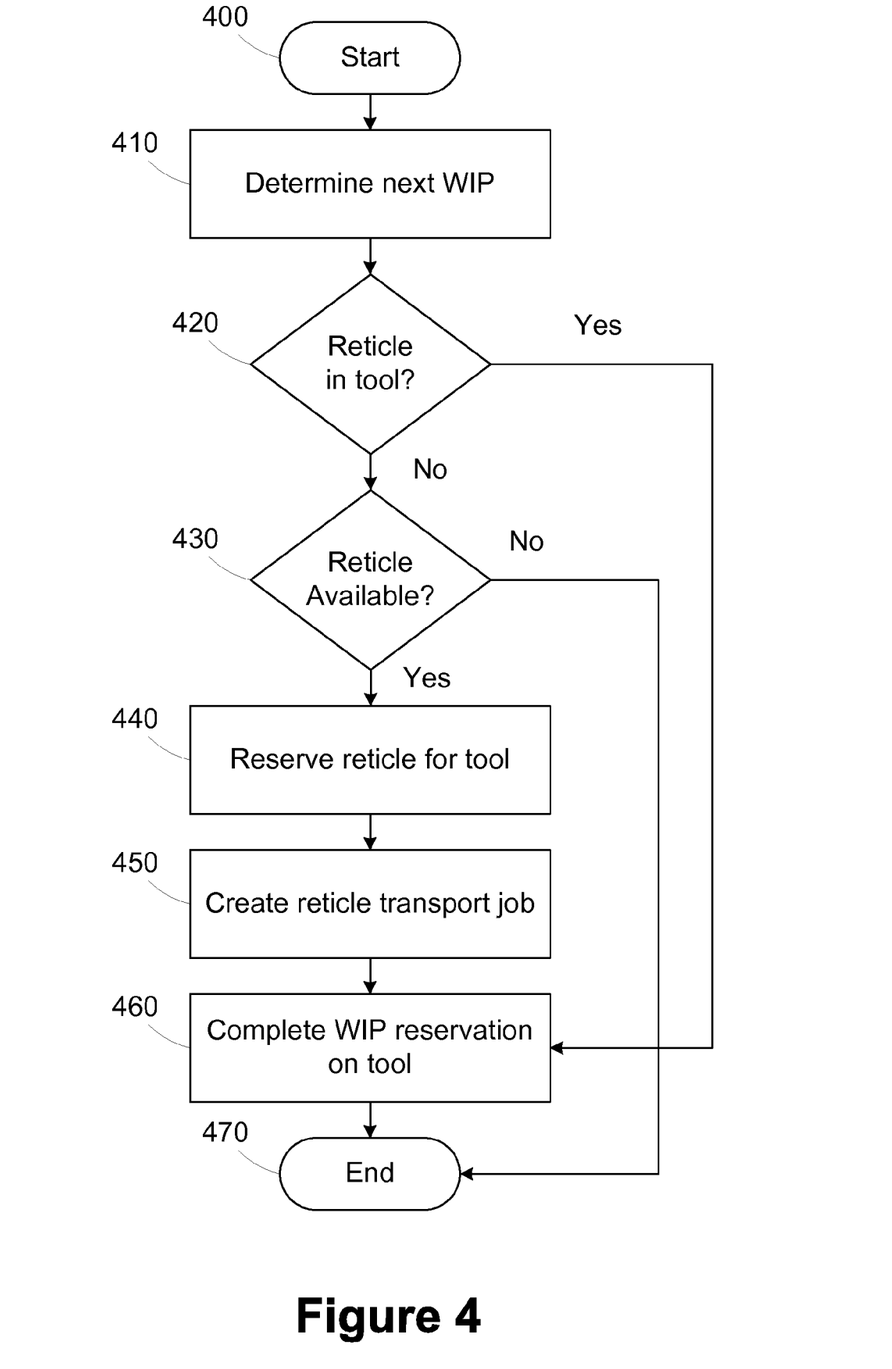

Turning now to FIG. 4, a simplified diagram of another embodiment of a method for generating reticle transport jobs and tool reservations is provided. While the embodiment of FIG. 3 evaluated the current lot being dispatched to the tool, the embodiment of FIG. 4 uses a look-ahead approach to identify future candidate lots for the tool (i.e., a queue of wafer jobs organized by lot or individual wafers). The method starts in method block 400. The coordinator 130 identifies the next WIP (i.e., as opposed to the current WIP) in method block 410. The coordinator 130 may evaluate one or more wafer jobs upcoming in the queue. In method block 420, the coordinator 130 determines if the reticle for the next WIP is in the tool. If the reticle is not I the tool, the coordinator 130 determines if the reticle is available in method block 430. If the reticle is available in method block 430, the coordinator 130 reserves the reticle for the tool in method block 440, creates a reticle transport job to send the reticle to the tool in method block 450, and completes a reservation for the WIP in the tool in method block 460. The method terminates in method block 470. If the reticle is in the tool in method block 420, the coordinator 130 proceeds with completing the WIP reservation for the tool in method block 460. If the reticle is not available in method block 430, the method terminates in method block 470, and no reservation is made for the WIP. The approach of FIG. 4 also allows a tool reservation to be initiated even though the reticle is not currently available in the tool. The presence of the reticle transport job allows the tool reservation to be completed.

Figure 5:
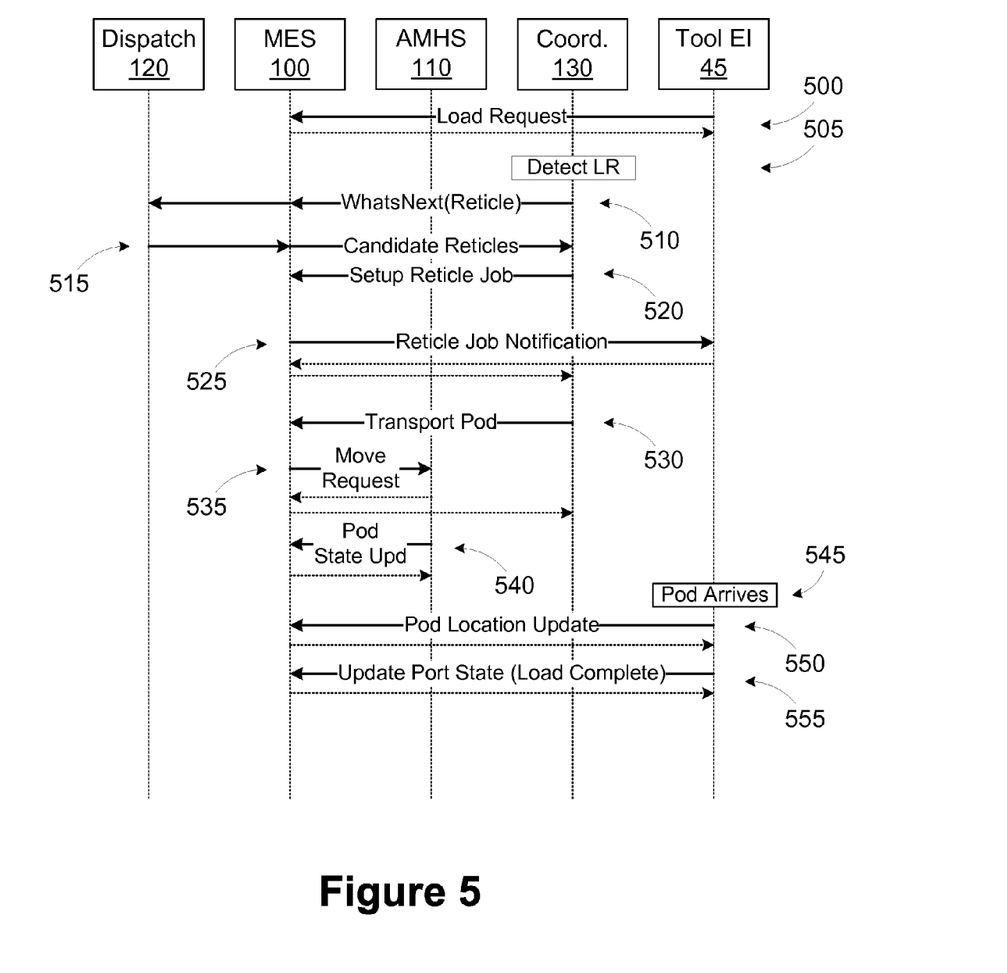
FIGS. 5 and 6 are event diagrams illustrating how reticle transport jobs are completed in the system of FIGS. 1 and 2.
Figure 6:
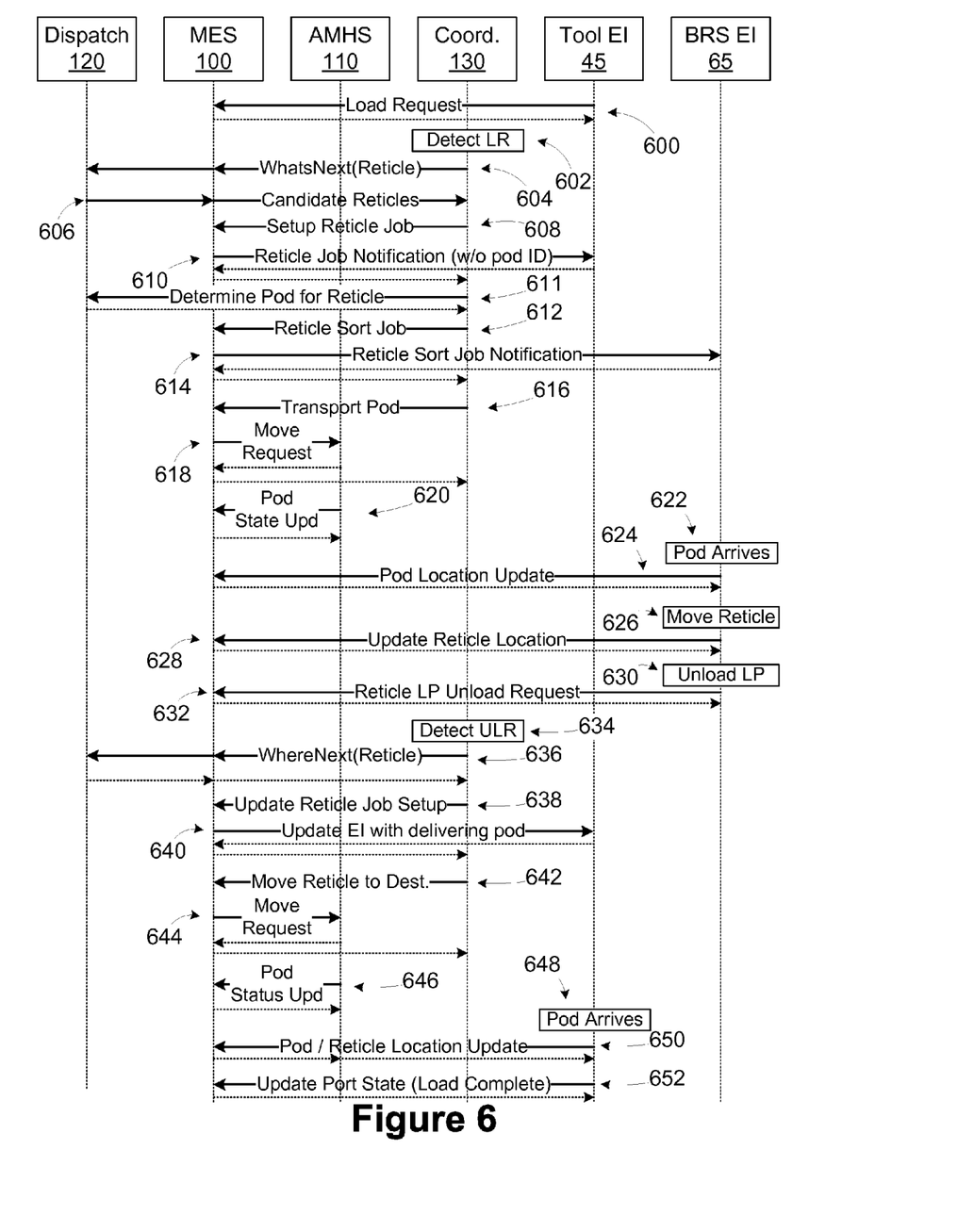

FIGS. 5 and 6 are event diagrams illustrating the message exchange between various entities in the manufacturing system 10 for generating reticle transport jobs. In FIG. 5, the manufacturing system does not have a bare reticle stocker 60. In such an embodiment, all reticle sets are located in pods, either at various tools, or in holding positions within the material handling system.

In FIG. 5, the tool EI 45 issues a reticle port load request to the MES 100 represented by event 500 and accompanying acknowledgement shown in dashed lines. The load request may be issued in response to a reticle load port being unoccupied. For example, a reticle pod may be moved to a different tool, thereby providing an open port. Also, a reticle load port may remain open for a period of time. During that time, the tool EI 45 may periodically issue load requests until the port is filled with a reticle. If the system decides that no reticle transport is to occur, the tool EI 45 may wait for a predetermined period of time prior to reissuing a load request. The coordinator 130 may identify the load request indirectly by snooping the event logs of the MES 100, as represented by event 505 or in response to a notification by the MES 100.

The coordinator 130 issues a WhatsNext(Reticle) request in event 510 to identify a reticle required for subsequent WIP. In event 515, the dispatch unit 120 responds to the coordinator 130 with one or more candidate reticles. For example, the methods of FIG. 3 or FIG. 4 may be used to identify a required reticle, and the dispatch unit 120 may inform the coordinator 130 if a reticle is available in event 515.

The coordinator 130 sets up a reticle transport job with the MES 100 in event 520. The MES 100 notifies the tool EI 45 of the reticle transport job in event 525. Upon receiving an acknowledgement from the tool EI 45, the MES 100 notifies the coordinator 130 of the acknowledgement. The coordinator 130 issues the transport pod job to the MES 100 in event 530, and the MES 100 issues a move request to the AMHS 110 in event 535 to initiate transport of the pod.

The AMHS 110 updates the pod state in event 540 as the transport commences. Event 545 represents the arrival of the pod at the tool. The tool EI 45 sends a pod location update to the MES 100 in event 550 when the pod arrives, and sends an update to the MES 100 of the reticle load port state in event 555 as the load completes.

In the embodiment of FIG. 5, because the reticles are all loaded into pods, the pod identifier can be determined automatically prior to setting up the reticle job. However, in implementations using the bare reticle stocker 60, a reticle may not be loaded into a pod. The event diagram of FIG. 6 illustrates how a reticle job can be initiated prior to the identity of the reticle pod being determined and updated as the information becomes available.

In FIG. 6, the tool EI 45 issues a reticle port load request to the MES 100 represented by event 600 and accompanying acknowledgement shown in dashed lines. The coordinator 130 may identify the load request indirectly by snooping the event logs of the MES 100, as represented by event 602 or in response to a notification by the MES 100. For example, the reticle load port may be empty, or a need for a reticle may have been identified via look ahead. The coordinator 130 issues a WhatsNext(Reticle) request in event 604 to identify a reticle required for subsequent WIP. In event 606, the dispatch unit 120 responds to the coordinator 130 with one or more candidate reticles. Again, the methods of FIG. 3 or FIG. 4 may be used to identify a required reticle, and the dispatch unit 120 may inform the coordinator 130 if a reticle is available in event 606.

The coordinator 130 sets up a reticle transport job with the MES 100 in event 608. The MES 100 notifies the tool EI 45 of the reticle transport job in event 610. Upon receiving an acknowledgement from the tool EI 45, the MES 100 notifies the coordinator 130 of the acknowledgement. In the reticle job setup, the coordinator 130 knows the identity of the reticle, but the identity of the pod may be unknown, as the reticle may be in the bare reticle stocker 60. Hence, the pod ID information is left incomplete in the reticle job. If the requested reticle were already in a pod, the reticle job could be completed and the events would proceed as shown in FIG. 5 (i.e., events 520-535). Assuming the reticle job cannot be fully specified, the coordinator 130 interfaces with the dispatch unit 120 to identify a pod for the reticle in event 611. Subsequently, the coordinator 130 initiates tasks to load the reticle into the pod. To that end, the coordinator 130 issues a reticle sort job to the MES 100 in event 612 that specifies the required reticle and the identified pod. The MES 100 sends a reticle sort job notification to the bare reticle stocker EI 65 in event 614. The coordinator 130 sends a transport pod request to the MES 100 requesting an available pod in event 616, and the MES 100 issues a move request to the AMHS 110 in event 618.

The AMHS 110 sends a pod state update to the MES 100 in event 620 after commencing the movement of a pod. The pod arrives at the bare reticle stocker 60 in event 622 and the bare reticle stocker EI 65 sends a location update to the MES 100 in event 624. The bare reticle stocker 60 moves the reticle to the pod in event 626 and updates the reticle location with the MES 100 in event 628. The bare reticle stocker 60 unloads the load port in event 630 and sends an unload request to the MES 100 in event 632. The coordinator 130 detects the unload request (i.e., indirectly or directly) in event 634 and issues a WhereNext(Reticle) request to the MES 100 in event 636. Upon receiving the WhereNext(Reticle) request, the MES 100 coordinates with the dispatch unit 120 to identify the tool that had requested the reticle and returns the result to the coordinator 130.

The coordinator 130 updates the reticle job with the pod ID in event 638, and the MES 100 informs the tool EI 45 of the update in event 640. The coordinator 130 issues a request to the MES 100 to move the pod to the tool in event 642, and the MES 100 issues a move request to the AMHS 110 in event 644. The AMHS 110 updates the pod status in event 646 upon commencing the move. The pod arrives at the tool in event 648, and the tool EI 45 updates the pod and reticle locations in event 650. The tool EI 45 also sends an update to the MES 100 of the reticle load port state in event 652 as the load completes.

As described in the scenario of FIG. 6, the reticle pod ID was not known at the time the reticle job was created. As the reticle was identified and loaded into a pod by the bare reticle stocker 60, this information became available and the reticle job was updated. The creation of the reticle job with incomplete information allows the parallel creation and management of the lot job so that the lot transport can be arranged and the lot and required reticle may be reserved prior to the reticle being present at the tool. In this manner, workflow efficiency may be increased. The coordinator 130 reduces the likelihood of bottlenecks cause by reticles by proactively scheduling reticle jobs necessary to support the upcoming WIP.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

We claim:

1. A method, comprising:
generating a reticle transport job using a computing device, the reticle transport job identifying a selected reticle;
notifying a photolithography tool of the reticle transport job without identifying a reticle pod for transporting the selected reticle using the computing device;
autonomously identifying a reticle pod available for transporting the selected reticle using the computing device;
updating the reticle transport job with an identifier of the identified reticle pod using the computing device; and
notifying the photolithography tool of the updated reticle transport job after identifying the reticle pod using the computing device.

2. The method of claim 1, further comprising:
storing a state of the selected reticle in a data store; and
updating the reticle state using the computing device responsive to the identified reticle pod delivering the selected reticle to a photolithography tool.

3. The method of claim 1, further comprising:
identifying in the computing device a current wafer job to be processed by a photolithography tool using the selected reticle;
determining if the selected reticle is available on the photolithography tool; and
generating the reticle transport job responsive to the selected reticle not being available on the photolithography tool.

4. The method of claim 3, further comprising generating a reservation for the wafer job on the tool responsive to generating the reticle transport job.

5. The method of claim 1, further comprising:
generating a queue of wafer jobs to be processed by at least one photolithography tool;
determining reticle requirements for at least a subset of the wafer jobs;
determining if the selected reticle specified by the reticle requirements for a selected wafer job is available on the photolithography tool; and
generating the reticle transport job responsive to the selected reticle not being available on the photolithography tool.

6. The method of claim 5, further comprising generating a reservation for the wafer job on the tool responsive to generating the reticle transport job.

7. The method of claim 1, further comprising:
sending the reticle transport job to a bare reticle stocker operable to store a plurality of reticles;
dispatching the identified reticle pod to the bare reticle stocker; and
updating the reticle transport job with the identifier of the reticle pod responsive to the bare reticle stocker loading the selected reticle in the reticle pod.

8. A system, comprising:
a photolithography tool;
a material handling system for transporting reticles and wafers to the tool;
a coordinator operable to generate a reticle transport job identifying a selected reticle required by the photolithography tool, notify the photolithography tool of the reticle transport job without identifying a reticle pod for transporting the reticle, identify a reticle pod available for transporting the selected reticle, update the reticle transport job with an identifier of the identified reticle pod, and notify the photolithography tool of the updated reticle transport job after identifying the reticle pod.

9. The system of claim 8, further comprising a manufacturing execution system operable to store a state of the selected reticle in a data store and update the reticle state responsive to the material handling system delivering the identified reticle pod with the selected reticle to the photolithography tool.

10. The system of claim 8, wherein the coordinator is further operable to identify a current wafer job to be processed by the photolithography tool using the selected reticle, determine if the selected reticle is available on the photolithography tool, and generate the reticle transport job responsive to the selected reticle not being available on the photolithography tool.

11. The system of claim 10, wherein the coordinator is further operable to generate a reservation for the wafer job on the tool responsive to generating the reticle transport job.

12. The system of claim 8, wherein the coordinator is further operable to evaluate a queue of wafer jobs to be processed, determine reticle requirements for at least a subset of the wafer jobs, determine if the selected reticle specified by the reticle requirements for a selected wafer job is available on the photolithography tool, and generate the reticle transport job responsive to the selected reticle not being available on the photolithography tool.

13. The system of claim 12, wherein the coordinator is further operable to generate a reservation for the wafer job on the tool responsive to generating the reticle transport job.

14. The system of claim 8, further comprising a bare reticle stocker operable to store a plurality of reticles, wherein the coordinator is further operable to send the reticle transport job to the bare reticle stocker, dispatch the identified reticle pod to the bare reticle stocker, and update the reticle transport job with the identifier of the reticle pod responsive to the bare reticle stocker loading the selected reticle in the reticle pod.

15. A system, comprising:
means for generating a reticle transport job using a computing device, the reticle transport job identifying a selected reticle;
means for notifying a photolithography tool of the reticle transport job without identifying a reticle pod for transporting the selected reticle using the computing device;
means for autonomously identifying a reticle pod available for transporting the selected reticle using the computing device;
means for updating the reticle transport job with an identifier of the identified reticle pod using the computing device; and
means for notifying the photolithography tool of the updated reticle transport job after identifying the reticle pod using the computing device.

* * * * *